United States Patent [19]

Garcia et al.

[11] Patent Number: 4,514,489
[45] Date of Patent: Apr. 30, 1985

[54] PHOTOLITHOGRAPHY PROCESS

[75] Inventors: Carlos N. Garcia, Tolleson; Bryan C. Rigg; Sally A. Tanner, both of Phoenix, all of Ariz.

[73] Assignee: Motorola, Inc., Shaumburg, Ill.

[21] Appl. No.: 528,500

[22] Filed: Sep. 1, 1983

[51] Int. Cl.$^3$ ............................ G03C 5/00; G03F 9/00
[52] U.S. Cl. ........................................ 430/327; 430/5; 430/311; 427/38; 427/43.1
[58] Field of Search ............................ 430/5, 311, 327; 427/43.1, 38, 164

[56] References Cited

U.S. PATENT DOCUMENTS 3,600,243  8/1971  La Rocque et al. ..................... 156/3
3,892,900  7/1975  Shima et al. ........................... 428/40

FOREIGN PATENT DOCUMENTS 53-82271   7/1978   Japan ..................................... 430/5
53-117973  10/1978  Japan ..................................... 430/5
53-122427  10/1978  Japan ................................... 430/327
55-099932  7/1980   Japan ................................... 427/43.1
55-088057  7/1980   Japan ..................................... 430/5
56-32143   4/1981   Japan ..................................... 430/5

Primary Examiner—John E. Kittle
Assistant Examiner—José G. Dees
Attorney, Agent, or Firm—John A. Fisher

[57]  ABSTRACT

An improved photolithography process is disclosed wherein photoresist masks are treated to reduce the sticking of photoresist to the mask. In many photolithography processes, a photoresist layer is exposed through a photoresist mask having an opaque patterned layer on a surface of the mask. To prevent adhesion of the photoresist to the mask surface when the mask and photoresist are brought into contact, the mask surface is first treated in a fluorine plasma.

5 Claims, 3 Drawing Figures

PHOTOLITHOGRAPHY PROCESS

BACKGROUND OF THE INVENTION

This invention relates generally to photolithographic processing, and more specifically to a photolithographic process in which adhesion between mask and photoresist is reduced.

Photolithography is widely used to provide a precision mask on a surface which is to be etched or otherwise acted upon. For example, photolithography is used in the semiconductor industry to provide an etch mask for insulator or metal layers, or to form an ion implantation mask. In such an application a layer of photoresist material is applied to the surface to be acted upon and this material is selectively exposed to actinic radiation through a patterned photomask. A photomask is a transparent plate, such as a glass plate, having an opaque patterned layer of emulsion or metal on a surface of the plate. In certain processes, known as "contact printing processes", in which the patterned layer is brought into contact with the photoresist material, a common problem is the random adherence of the photoresist to the mask surface when the mask and photoresist are subsequently taken out of contact.

The problem of photoresist adhesion to the mask is of an intermittent nature. Small pieces of photoresist may stick randomly over the mask surface. The problem seems to be dependent on a variety of conditions including ambient humidity and immediately prior processing.

The problem of photoresist adherence to the mask engenders a number of problems. The portion of photoresist which sticks to the mask causes a loss of yield because the photoresist is no longer in place for masking. In addition, in a normal photolithography production process the same photomask is used to pattern a series of substrates. The series of substrates are rapidly processed in sequence without an opportunity for cleaning the mask between uses. Even if time for cleaning is available, mask cleaning is impractical because the mask cleaning process may also damage the mask, especially an emulsion mask. The photoresist which adheres to the mask while processing one substrate in the series causes a loss of yield to each subsequent substrate in the series. The adherent photoresist damages the resist which it subsequently contacts and may even cause further adherence.

Attempts have been made to reduce the incidence of photoresist adherence. For example, various coatings have been proposed which, upon application to the surface of the mask, are designed to reduce adherence. These coatings have not generally been found to be satisfactory.

Thus a need existed to provide an improved photolithography process which would overcome the above-identified problems associated with prior photolithography processes.

It is therefore an object of this invention to provide an improved photolithography process.

It is another object of this invention to provide an improved method for decreasing the adherence of photoresist to the surface of a mask.

It is yet another object of this invention to provide an improved process for fabricating a semiconductor device.

BRIEF SUMMARY OF THE INVENTION

The foregoing and other objects of the invention are achieved through a process in which a photomask to be used in a photolithographic process is subjected to a fluorine plasma. A photomask including a layer of opaque patterned material for use in a photolithographic patterning process is placed in a plasma apparatus and subjected to a fluorine based plasma to condition the surface of the mask to reduce adherence of photoresist to that surface.

DETAILED DESCRIPTION OF PREFERRED EMBODIMENTS

Figure 1:
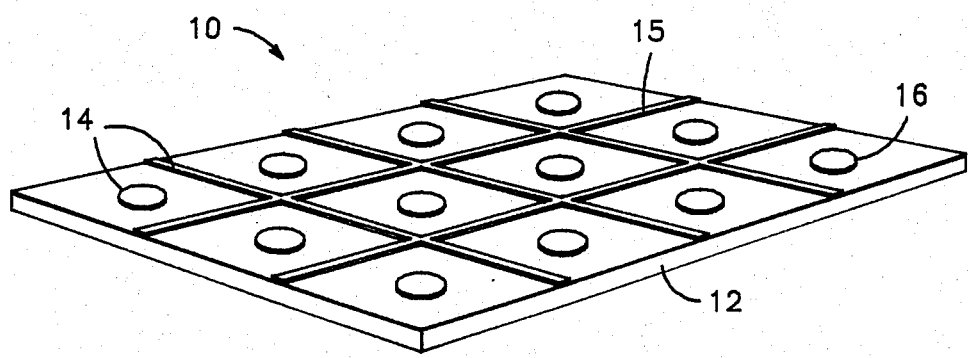
FIG. 1 illustrates a photomask.

FIG. 1 illustrates a photomask 10 such as a mask which might be used in the semiconductor industry. Mask 10 includes a transparent plate 12 having a pattern 14 on one surface. Mask plate 12 is typically a glass plate, but can be made of other transparent materials such as quartz or the like. Pattern 14 is here illustrated as simply an opaque rectangular grid 15 having an opaque circle 16 within each rectangle. This pattern is representative of a pattern which might be used as a mask for patterning contact openings and scribe lines for a simple semiconductor device. The pattern can be, of course, as simple or complicated as necessary for the particular device being fabricated. In one embodiment, the pattern 14 comprises a patterned photographic emulsion material adherent to mask plate 12. Alternatively, the pattern can comprise, for example, a patterned layer of chrome.

Figure 2:
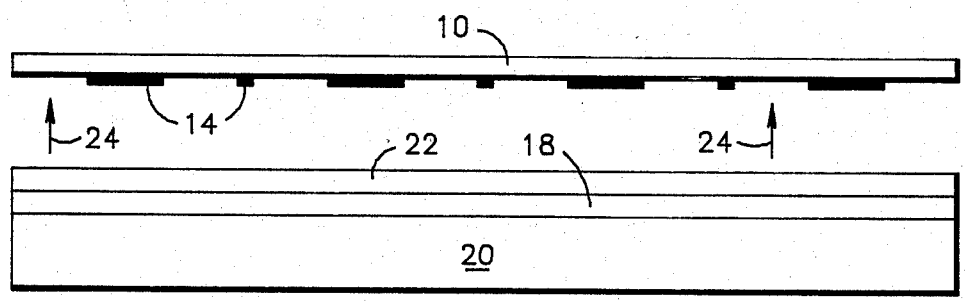
FIG. 2 illustrates the use of a photoresist mask in a photolithography process.

FIG. 2 illustrates in cross section the use of photomask 10 in photolithographically patterning an oxide layer 18 overlying a semiconductor wafer 20. A layer of photoresist material 22 overlies the oxide layer. The emulsion pattern 14 on photomask 10 is shown upstanding from the surface of mask 10; the amount by which the pattern extends above the surface is exaggerated in this figure.

In practicing the photolithography process, photomask 10 is brought into close proximity to the surface of photoresist layer 22. Mask 10 is aligned with any pattern previously existing on wafer 20. The alignment is accomplished by looking through mask 10, using a microscope, and superimposing pattern 14 on any existing pattern. When the alignment is believed to be correct, the mask and wafer are moved relative to each other as indicated by arrows 24 to cause a direct contact between the patterned surface of mask 10 and the photoresist layer 22. After the mask and photoresist layer are forced into contact, the pattern alignment is rechecked. If the patterns are not adequately aligned the mask and photoresist layer are taken out of contact and the alignment sequence and contact is repeated. Each use of the mask, therefore, may involve one or more contacts between mask and photoresist.

If the alignment is determined to be adequate, the photolithography process is continued by exposing the photoresist through the photomask to create a pattern of exposed and unexposed photoresist areas. The mask and wafer are taken out of contact and the photoresist layer is developed to form a pattern (replicating the pattern on the mask) of either exposed or unexposed photoresist regions depending upon the type of photoresist used. The patterned photoresist is then used as a mask to selectively perform an operation such as the selective etching of oxide layer 18. Any incidence of photoresist adhesion to the mask will interfere with the desired replication. Regions of the wafer from which the photoresist has been removed by adhesion to the mask will not be properly masked and will not yield working devices.

In a typical semiconductor production operation the same photoresist mask is used to sequentially process, in the same manner, a plurality of identical wafers. The mask is used, for example, to process about 15–25 semiconductor wafers. The mask is not cleaned between uses, so any photoresist which adheres to the mask during the processing of one wafer is also present when each subsequent wafer is processed. The build-up of photoresist on the mask causes a decline in yield on each subsequent wafer. The number of wafers processed with a given photomask is selected as a trade-off between yield, cost of masks, and process throughput. Cleaning the mask between sequential uses might reduce the problem of photoresist build-up, but only at the cost of decreased throughput and possible damage to the mask from the cleaning. Emulsion masks, for example, are usually discarded after processing 15–25 wafers rather than being cleaned and reused.

In accordance with the invention, the surface of the photomask is treated to reduce the adhesion between that surface and a photoresist layer. The surface is treated in plasma equipment such as any of the commonly used plasma reactors used for etching, ashing, or deposition. The reactor can be of the parallel plate type, barrel type, or the like. Masks to be treated are placed in the reactor either lying horizontally on a platen or stacked upright in a boat or holder depending on the type of reactor used. The way masks are placed in the apparatus and the number of masks processed together are not important to the invention except that the surface of the mask that is to come into contact with the photoresist must be exposed to the plasma, and a loading effect is noted with large numbers of masks. That is, the surface treatment must be continued longer for a large number of masks than for a small number.

The masks to be treated are placed in the plasma reactor and there subjected to the action of a fluorine containing plasma. The plasma contains, for example, $CF_4$ or mixtures of $CF_4$ and oxygen. A mixture of $CF_4$ and oxygen containing about 8.5% oxygen, for example, a mixture sometimes used in etching silicon nitride and the like, is effective in treating the mask surface. A pure oxygen plasma, however, is not effective in reducing adherence of photoresist to the mask surface. A wide range of other fluorine materials such as the fluorocarbons including $CHF_3$, $C_2F_6$, $C_3F_8$ and the like and mixtures thereof are effective in achieving the desired result.

A wide range of plasma treatment conditions have been found to reduce the adherence of photoresist to the treated surface. In one preferred process masks are treated in a Tegal 421 barrel type plasma etcher for about 2–10 minutes. The reactor chamber is heated to about 65° C. and pressure within the chamber is adjusted to 0.4–0.5 mm Hg. Using $CF_4$ or mixtures of $CF_4$ and oxygen as the source of the fluorine plasma species, the masks are treated for about 2–15 minutes in the plasma. A two minute treatment in this equipment has been found effective for the treatment of five or less masks. Using a minimum treatment of two minutes, however, the effect on the mask surface is found to be fully effective for only about 24 hours. A treatment of three minutes or longer is found to be effective for one week or more. When treating six or more masks at the same time, it has been found preferable to increase the treatment time to five minutes or more. Following the plasma treatment, masks are removed from the plasma apparatus and are inspected. The only effects noted are a light haze around the perimeter of the masks and a slight darkening of the opaque areas. The surface treatment has been found to last for at least about one week. In the event that masks are not used within one week of treating, no difficulties have been found with retreating the same mask.

Masks treated in the above described manner have been found to have a significantly reduced photoresist adherence. The reduced adhesion has been observed with emulsion masks and even with bare glass plates without any pattern. The adherence of photoresist is so reduced, in fact, that the lifetime of the mask is significantly extended. That is, masks can now be used for the processing of a significantly increased number of wafers.

Figure 3:
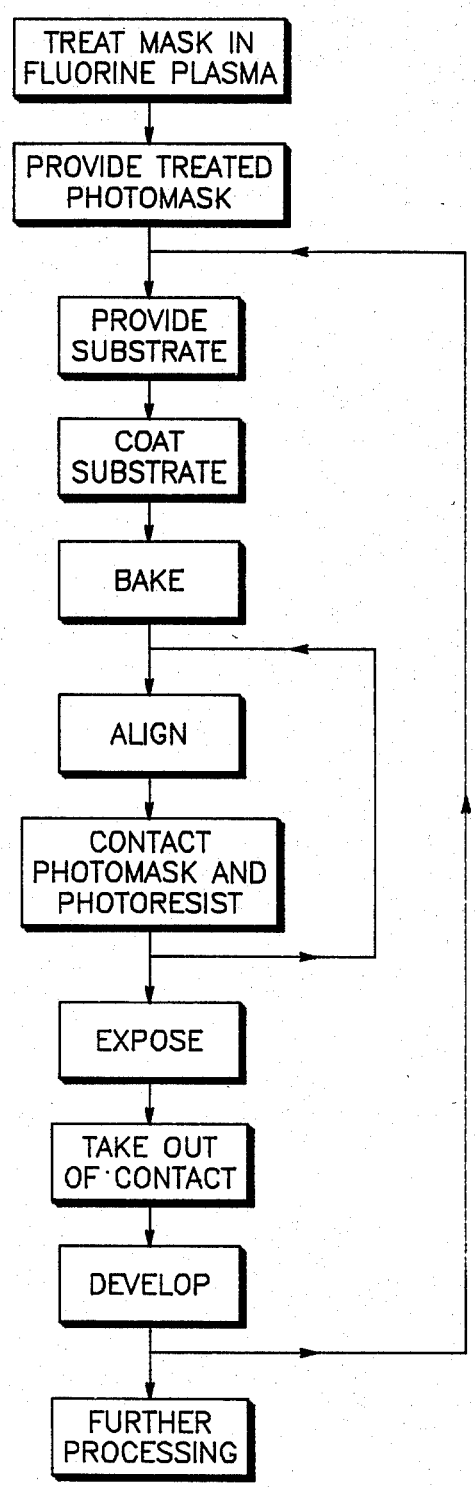
FIG. 3 is a flow diagram illustrating the sequence of steps in a photoresist process in accordance with the invention.

FIG. 3 is a flow diagram illustrating a sequence of process steps for processing a substrate such as a semiconductor wafer in accordance with one embodiment of the invention. A photomask having an opaque pattern on one surface is treated in a fluorine plasma, as described above, to reduce the adherence of photoresist to that surface. A plurality of photomask can be treated in this manner and stored for several days before use. When a group of semiconductor wafers is ready for a photolithographic process, one of the treated masks is mounted in a photoresist alignment tool. The semiconductor wafer, which may have layers of oxide, nitride, metal, or the like on a surface thereof are coated with a layer of photoresist. The photoresist can be a material such as HR-100 or HR-300 supplied by the Hunt Chemical Company or KTI-105 supplied by KTI Chemicals, Incorporated. After applying the photoresist material, the wafer is heated to about 75° C. in a nitrogen ambient for five minutes to remove most of the solvents from the resist.

One of the wafers having a photoresist layer thereon is mounted in the photoresist alignment equipment in close proximity to but not contacting the treated photomask. The mask and photoresist layer are parallel to each other with the patterned surface of the photomask facing the photoresist layer. The photomask is then aligned with the pattern already existing on the wafer or with keys on the wafer or with respect to the wafer flat if this is the first pattern applied to the wafer. After mask or wafer position has been adjusted to achieve the proper registration, the photomask and photoresist layer are brought into contact. The alignment is rechecked and if not adequate, the photomask and wafer are taken out of contact and the alignment is readjusted. When the alignment is satisfactory, the photoresist layer is exposed to actinic radiation through the photomask with the opaque pattern selectively masking the photoresist layer from the impinging radiation. The selective exposure creates regions of exposed photoresist and regions of unexposed photoresist. The photomask and wafer are taken out of contact and the photoresist layer is subjected to a developer. Regions of exposed and unexposed photoresist react differently to the action of the developer so that a pattern of exposed photoresist (when negative photoresist is used) remains on the substrate. This photoresist pattern is then used to perform some process step on the wafer. The process step can be, for example, etching of a pattern in the wafer or a layer on the wafer, or the masked ion implantation of an impurity into the wafer. After the photomask and wafer are taken out of contact and the wafer is sent on to be developed, the process can be repeated using the treated photomask to pattern a photoresist layer on another wafer.

Thus, it is apparent that there has been provided, in accordance with the invention, a process for treating the surface of photomasks which fully meets the objects and advantages set forth above. The invention has been described and illustrated with respect to specific embodiments thereof, but it is not intended that the invention be limited to these illustrative embodiments. The invention has been described, for example, with respect to the use of photomasks in the patterning of layers on semicondutor wafers. Those skilled in the art, after review of the foregoing detailed description, will appreciate that treated photomasks can be used in numerous other applications or with other substrates. Accordingly, all variations and modifications which fall within the scope of the invention are intended to be included within the appended claims.

We claim:

1. In a process for fabricating a semiconductor device including one or more photolithographic patterning steps utilizing a patterned photomask having an opaque pattern on a surface thereof, the improvement comprising: treating the surface of said photomask in a mixture of fluorinated carbon and oxygen plasma.

2. The improvement of claim 1 wherein said plasma comprises a mixture of $CF_4$ and $O_2$.

3. The improvement of claim 1 wherein said step of treating comprises subjecting said surface to a mixture of fluorinated carbon and oxygen plasma for 2-15 minutes.

4. A process for fabricating a semiconductor device including a semiconductor wafer and a layer on said wafer to be patterned, the process comprising the steps of: providing a photomask including a transparent plate having an opaque pattern on a surface thereof; exposing said opaque pattern to a mixture of fluorocarbon and oxygen plasma; forming a layer of photoresist on said layer; contacting said photomask and said layer of photoresist; and exposing said layer of photoresist through said photomask and separating said photomask and said layer with substantially none of said layer sticking to said photomask.

5. An improved photolithography process wherein the same photomask is used to sequentially process, in the same manner, a plurality of identical wafers, the improvement which comprises: treating said photomask in a mixture of fluorocarbon and oxygen plasma before contacting a layer of photoresist.

* * * * *